(12) United States Patent
Leisenheimer et al.

(10) Patent No.: US 11,150,108 B2
(45) Date of Patent: Oct. 19, 2021

(54) REDUNDANT HALL ANGLE MEASUREMENT IN A CHIP

(71) Applicant: Infineon Technologies AG, Neubiberg (DE)

(72) Inventors: Stephan Leisenheimer, Deisenhofen (DE); Richard Heinz, Munich (DE)

(73) Assignee: Infineon Technologies AG

( * ) Notice: Subject to any disclaimer, the term of this patent is extended or adjusted under 35 U.S.C. 154(b) by 247 days.

(21) Appl. No.: 16/544,027

(22) Filed: Aug. 19, 2019

(65) Prior Publication Data

US 2021/0055130 A1    Feb. 25, 2021

(51) Int. Cl.
  *G01R 33/00*    (2006.01)
  *G01D 5/14*    (2006.01)
  *G01R 33/07*    (2006.01)

(52) U.S. Cl.
  CPC ........... *G01D 5/145* (2013.01); *G01R 33/077* (2013.01)

(58) Field of Classification Search
  CPC ........................... G01R 33/00; G01R 33/0035; G01R 33/0023; G01R 33/0017; G01R 31/3191; G01R 33/077; G01B 7/004; G01C 17/38; G06F 3/017; G06F 3/0346; G06F 3/012; G01D 5/145
  See application file for complete search history.

(56) References Cited

U.S. PATENT DOCUMENTS

| | | | |
|---|---|---|---|
| 2005/0162160 A1* | 7/2005 | Ausserlechner | ...... G01L 5/0047 324/251 |
| 2006/0097715 A1* | 5/2006 | Oohira | ..................... H01L 27/22 324/207.2 |
| 2013/0057256 A1* | 3/2013 | Ernst | ................... G01R 33/0005 324/202 |
| 2015/0022192 A1* | 1/2015 | Ausserlechner | ..... G01R 33/022 324/207.25 |

* cited by examiner

*Primary Examiner* — Jermele M Hollington
*Assistant Examiner* — Taqi R Nasir
(74) *Attorney, Agent, or Firm* — Design IP (57) ABSTRACT

A magnetic angle sensor includes a semiconductor chip that includes: a pair of vertical Hall sensor elements configured to generate vertical Hall sensor signals in response to a magnetic field impinging thereon; a first pair of lateral Hall sensor elements configured to generate first lateral Hall sensor signals in response to the magnetic field impinging thereon; a second pair of lateral Hall sensor elements configured to generate second lateral Hall sensor signals in response to the magnetic field impinging thereon; and a sensor circuit configured to: determine a first angle value corresponding to an orientation of the magnetic field based on the vertical Hall sensor signals, determine a second angle value corresponding to the orientation of the magnetic field based on the first and the second lateral Hall sensor signals, and determine whether the first and the second angle values are within an acceptable tolerance range of each other.

20 Claims, 5 Drawing Sheets

REDUNDANT HALL ANGLE MEASUREMENT IN A CHIP

FIELD

The present disclosure relates generally to magnetic angle sensors, and, more particularly, to diverse magnetic angle sensors integrated in a chip.

BACKGROUND

Today, vehicles feature numerous safety, body, and powertrain applications that rely on magnetic position and angle sensors. A magnetic angle sensor may be used to detect a rotational position or movement of a shaft or other rotatable object. For example, in Electric Power Steering (EPS), magnetic angle sensors can be used to measure steering angle and steering torque for steering wheel sensing. Modern powertrain systems can rely on magnetic angle sensors for camshaft, crankshaft, and transmission applications.

In addition, functional safety of electronic systems in automotive passenger cars is an important topic in the light of increasing automation and semiconductor content of modern cars. It is desirable to have a reliable and safe functionality for the safety critical parts deployed in the system.

One requirement, which may often exist in such safety-critical applications, is that malfunctions of a sensor device have to be detectable by the system, for example by an entity receiving signals from the sensor device. In other words, according to such a requirement it has to be possible to detect, if a sensor device delivers erroneous values, e.g., due to a fault of the sensor device. One approach to ensure this is to provide redundancy, for example to provide two separate sensors for measuring the same physical quantity. Deviations between measurements of the two sensor devices above a threshold may indicate a malfunction of at least one of the two sensors provided.

Meanwhile, cost is also a factor. Functional safety should be integrated cost-effectively. There is a desire to increase the integration density in a system for cost reduction. Thus, integrating two angle sensors in a single chip for providing redundancy may be desirable.

SUMMARY

Embodiments a directed to integrating diverse magnetic angle sensors in a single chip.

Embodiments further provide a magnetic angle sensor that includes a semiconductor chip; a pair of vertical Hall sensor elements integrated with the semiconductor chip and each configured to generate vertical Hall sensor signals in response to a magnetic field impinging thereon; a first pair of lateral Hall sensor elements integrated with the semiconductor chip and each configured to generate first lateral Hall sensor signals in response to the magnetic field impinging thereon; a second pair of lateral Hall sensor elements integrated with the semiconductor chip and each configured to generate second lateral Hall sensor signals in response to the magnetic field impinging thereon; and a sensor circuit integrated with the semiconductor chip. The sensor circuit is configured to: determine a first angle value corresponding to an orientation of the magnetic field based on the vertical Hall sensor signals, determine a second angle value corresponding to the orientation of the magnetic field based on the first lateral Hall sensor signals and the second lateral Hall sensor signals, determine whether the first angle value and the second angle value are within an acceptable tolerance range of each other, and generate an error indication on a condition that the first angle value and the second angle value are not within the acceptable tolerance range of each other.

The pair of vertical Hall sensor elements include a first vertical Hall sensor element sensitive to a first magnetic field component of the magnetic field aligned in a first direction and a second vertical Hall sensor element sensitive to a second magnetic field component of the magnetic field aligned in a second direction orthogonal to the first direction. The first pair of lateral Hall sensor elements include a first lateral Hall sensor element and a second lateral Hall sensor element both sensitive to the first magnetic field component. The second pair of lateral Hall sensor elements include a third lateral Hall sensor element and a fourth lateral Hall sensor element both sensitive to the second magnetic field component.

Embodiments further provide a magnetic angle sensor system that includes a magnet configured to rotate about a rotation axis and configured to produce a magnetic field; a semiconductor chip; a pair of vertical Hall sensor elements integrated with the semiconductor chip and each configured to generate vertical Hall sensor signals in response to the magnetic field impinging thereon; a first pair of lateral Hall sensor elements integrated with the semiconductor chip and each configured to generate first lateral Hall sensor signals in response to the magnetic field impinging thereon; a second pair of lateral Hall sensor elements integrated with the semiconductor chip and each configured to generate second lateral Hall sensor signals in response to the magnetic field impinging thereon; and a sensor circuit integrated with the semiconductor chip. The sensor circuit is configured to: determine a first angle value corresponding to an orientation of the magnetic field based on the vertical Hall sensor signals, determine a second angle value corresponding to the orientation of the magnetic field based on the first lateral Hall sensor signals and the second lateral Hall sensor signals, determine whether the first angle value and the second angle value are within an acceptable tolerance range of each other, and generate an error indication on a condition that the first angle value and the second angle value are not within the acceptable tolerance range of each other.

Embodiments provide a method for determining an orientation angle of a magnetic field. The method includes generating, by a pair of vertical Hall sensor elements integrated with the semiconductor chip, vertical Hall sensor signals in response to the magnetic field impinging thereon; generating, by a first pair of lateral Hall sensor elements integrated with the semiconductor chip, first lateral Hall sensor signals in response to the magnetic field impinging thereon; generating, by a second pair of lateral Hall sensor elements integrated with the semiconductor chip, second lateral Hall sensor signals in response to the magnetic field impinging thereon; determining, by a sensor circuit integrated with the semiconductor chip, a first angle value corresponding to an orientation of the magnetic field based on the vertical Hall sensor signals; determining, by the sensor circuit, a second angle value corresponding to the orientation of the magnetic field based on the first lateral Hall sensor signals and the second lateral Hall sensor signals; determining, by the sensor circuit, whether the first angle value and the second angle value are within an acceptable tolerance range of each other; and generating, by the sensor circuit, an error indication on a condition that the first angle value and the second angle value are not within the acceptable tolerance range of each other.

BRIEF DESCRIPTION OF THE DRAWINGS

Embodiments are described herein making reference to the appended drawings.

DETAILED DESCRIPTION

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

Embodiments relate to sensors and sensor systems, and to obtaining information about sensors and sensor systems. A sensor may refer to a component which converts a physical quantity to be measured to an electric signal, for example, a current signal or a voltage signal. The physical quantity may for example comprise a magnetic field, an electric field, a pressure, a force, a current or a voltage, but is not limited thereto. A sensor device, as described herein, may be an angle sensor, a speed sensor, a motion sensor, and the like.

A magnetic field sensor, for example, includes one or more magnetic field sensor elements that measure one or more characteristics of a magnetic field (e.g., an amount of magnetic field flux density, a field strength, a field angle, a field direction, a field orientation, etc.). The magnetic field may be produced by a magnet, a current-carrying conductor (e.g., a wire), the Earth, or other magnetic field source. Each magnetic field sensor element is configured to generate a sensor signal (e.g., a voltage signal) in response to one or more magnetic fields impinging on the sensor element. Thus, a sensor signal is indicative of the magnitude and/or the orientation of the magnetic field impinging on the sensor element.

It will be appreciated that the terms "sensor" and "sensing element" may be used interchangeably throughout this description, and the terms "sensor signal" and "measurement signal" may be used interchangeably throughout this description.

Magnetic sensors provided in the described embodiments include lateral and vertical Hall-effect sensors (Hall sensors). A Hall effect sensor is a transducer that varies its output voltage (Hall voltage) in response to a magnetic field. It is based on the Hall effect which makes use of the Lorentz force. The Lorentz force deflects moving charges in the presence of a magnetic field which is perpendicular to the current flow through the sensor or Hall plate. Thereby a Hall plate can be a thin piece of semiconductor or metal. The deflection causes a charge separation which causes a Hall electrical field. This electrical field acts on the charge in the opposite direction with regard to the Lorentz Force. Both forces balance each other and create a potential difference perpendicular to the direction of current flow. The potential difference can be measured as a Hall voltage and varies in a linear relationship with the magnetic field for small values. Hall effect sensors can be used for proximity switching, positioning, speed detection, and current sensing applications.

A vertical Hall sensor is a magnetic field sensor constructed with the Hall element perpendicular to the plane of the chip (e.g., extending from a main surface of the chip into the chip body). It senses magnetic fields perpendicular to its defined sensitive edge (top, right, or left, relative to the main surface of the chip). This generally means that a vertical Hall sensor is sensitive to a magnetic field component that extends parallel to their surface and parallel, or in-plane, to the main surface of the chip in which the vertical Hall sensor is integrated. In particular, a vertical Hall sensor may extend from the main surface into the chip. The plane of sensitivity may be referred to herein as a "sensitivity-axis" or "sensing axis" and each sensing axis has a reference direction. For vertical Hall sensor elements, voltage values output by the sensor elements change according to the magnetic field strength in the direction of its sensing axis.

On the other hand, a lateral (planar) Hall sensor is constructed with the Hall element in the same plane as the main surface of the chip. It senses magnetic fields perpendicular to its planar surface. This means they are sensitive to magnetic fields vertical, or out-of-plane, to the main surface of the chip. The plane of sensitivity may be referred to herein as a "sensitivity-axis" or "sensing axis" and each sensing axis has a reference direction. Similar to vertical Hall sensor elements, voltage values output by lateral Hall sensor elements change according to the magnetic field strength in the direction of its sensing axis.

A magnetic field component may be, for example, an x-magnetic field component (Bx), a y-magnetic field component (By), or a z-magnetic field component (Bz), where the Bx and By field components are in-plane to the chip, and Bz is out-of-plane to the chip in the examples provided.

According to one or more embodiments, a plurality of magnetic field angle sensors and a sensor circuitry may be both accommodated (i.e., integrated) in the same chip. The sensor circuit may be referred to as a signal processing circuit and/or a signal conditioning circuit that receives one or more signals (i.e., sensor signals) from one or more magnetic field sensor elements in the form of raw measurement data and derives, from the sensor signal, a measurement signal that represents the magnetic field.

In some cases, a measurement signal may be differential measurement signal that is derived from sensor signals generated by two sensor elements having a same sensing axis (e.g., two sensor elements sensitive to the same magnetic field component) using differential calculus. A differential measurement signal provides robustness to homogenous external stray magnetic fields.

Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a sensor output suitable for processing after conditioning.

Thus, the sensor circuit may include an analog-to-digital converter (ADC) that converts the analog signal from the one or more sensor elements to a digital signal. The sensor circuit may also include a digital signal processor (DSP) that performs some processing on the digital signal, to be discussed below. Therefore, a chip, which may also be referred to as an integrated circuit (IC), may include a circuit that conditions and amplifies the small signal of one or more magnetic field sensor elements via signal processing and/or conditioning.

A sensor device, as used herein, may refer to a device which includes a sensor and sensor circuit as described above. A sensor device may be integrated on a single semiconductor die (e.g., silicon die or chip). Thus, the sensor and the sensor circuit are disposed on the same semiconductor die.

Figure 1:
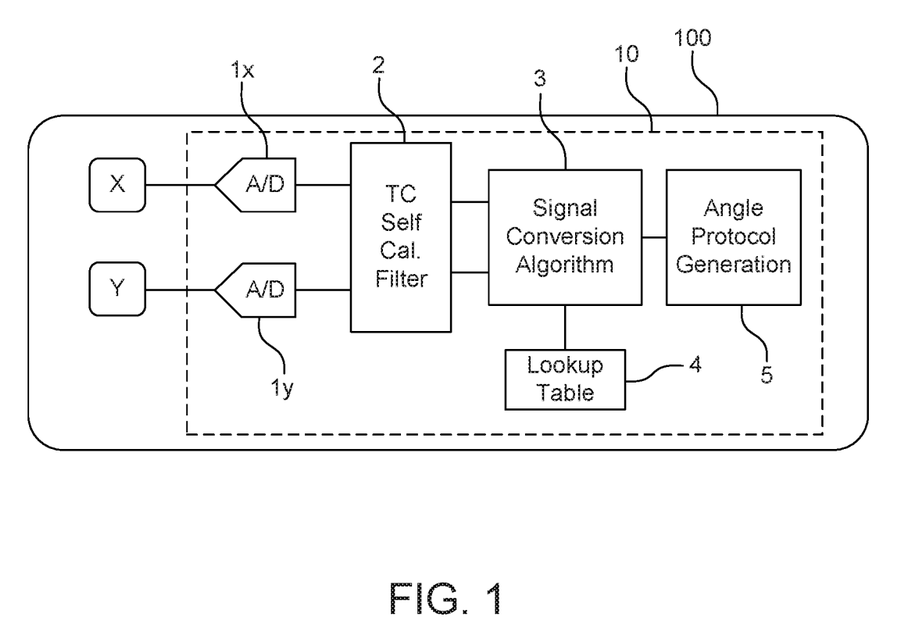
FIG. 1 is a block diagram illustrating a magnetic angle sensor 100 according to one or more embodiments.

FIG. 1 is a block diagram illustrating a magnetic angle sensor 100 according to one or more embodiments. The magnetic angle sensor 100 includes sensor elements X and Y that are configured to generate a sensor signal in response to a magnetic field impinging thereon.

The sensor elements X and Y may be arranged such that sensor element X and sensor element Y are set apart from each other by a predetermined distance such that two sensor signals are generated that are phase shifted from each other by 90°. In this case, the X sensor element and the Y sensor element may be both lateral Hall sensor elements or both vertical Hall sensor elements such that the sensor element X is configured to sense the sine angle component (e.g., x-component) of the magnetic field and the sensor element Y is configured to sense the cosine angle component (e.g., y-component) of the magnetic field.

The magnetic angle sensor 100 also includes a sensor circuit 10 that receives the sensor signals from the sensor elements X and Y for processing and for generation of an angle output signal. The sensor circuit 10 includes two signal paths: an X signal path and a Y signal path. The signal-X on the X signal path may be in a form of a sinusoidal (sine) waveform that represents an angular orientation of the target object, and the signal-Y on the Y signal path may be a similar waveform that is shifted 90° from signal-X. That is, signal-Y is a sinusoidal (cosine) waveform that represents an angular orientation of the target object. It will be appreciated that while the examples herein describe the sine waveform as being used as signal-X and the cosine waveform as being used as signal-Y, the opposite may also be true so long as the two signals are phase shifted 90° from each other.

Signal paths X and Y may include an ADC 1x and an ADC 1y, respectively, that convert the measurement signal of the respective signal path into a digital signal for further processing by a remaining portion of the sensor circuit 10.

In addition, a temperature compensation (TC), self-calibration, and filter block 2 may receive each of the measurement signals X and Y, and perform one or more signal conditioning operations thereof before outputting the measurement signals X and Y to signal conversion algorithm block 3.

The signal conversion algorithm block 3 is configured to receive signal-X and signal-Y for further processing. For example, the signal conversion algorithm block 3 may include one or more processors and/or logic units that performs various signal conditioning functions, such as absolute signal conversion, normalization, linearization, frequency increase, and so forth. One or more signal conditioning functions may be performed in combination with a lookup table stored in memory 4. The output of the signal conversion algorithm block 3 is provided an angle protocol block 5 that is configured to generate an angle signal as an output signal. Each "block" may include one or more processors for processing one or more signals.

Figure 2:
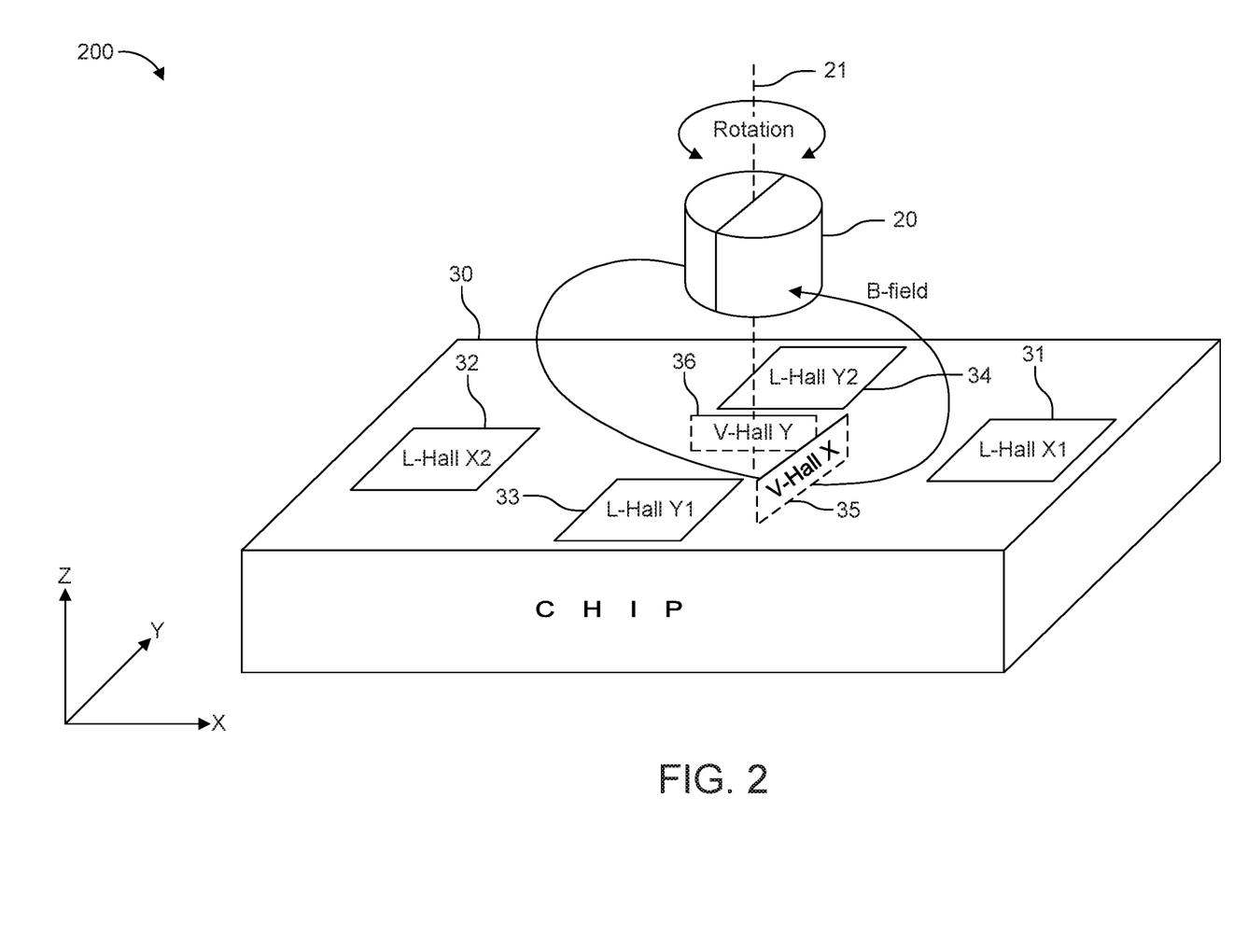
FIG. 2 is a diagram illustrating a magnetic angle sensor system 200 according to one or more embodiments.

FIG. 2 is a diagram illustrating a magnetic angle sensor system 200 according to one or more embodiments. The magnetic angle sensor system 200 includes a magnet 20 that is configured to rotate about a rotation axis 21. The magnet 20 is a diametrically polarized magnet that produces a magnetic field (B-field) whose orientation rotates as the magnet 20 rotates about the rotation axis 21. The magnet may be attached to a rotatable shaft (not illustrated).

In addition, the magnetic angle sensor system 200 includes a sensor chip 30 that is placed on the rotation axis 21 and proximate to the magnet 20. The sensor chip 30 is rotationally fixed with respect to the magnet 20, meaning that he chip 30 does not rotation. In the alternative, the sensor chip 30 may be configured to rotate about the rotation axis 21 while the magnet 20 is rotationally fixed. In either case, a rotating magnetic field is projected onto the chip 30 as the magnet 20 rotates with respect to the chip 30.

A plurality of Hall sensor elements are integrated on the chip 30 for angle measurement. In particular, four lateral Hall sensor elements 31-34 and two vertical Hall sensor elements 35 and 36 are provided.

Lateral Hall sensor element 31 (i.e., L-Hall X1) is a lateral Hall plate sensitive to the x-direction. Lateral Hall sensor element 32 (i.e., L-Hall X2) is also a lateral Hall plate sensitive to the x-direction. Lateral Hall sensor elements 31 and 32 form a first differential sensor pair that are used by sensor circuitry to generate a first differential measurement signal for an x-magnetic field component (Bx) of the magnetic field (B-field).

Lateral Hall sensor element 33 (i.e., L-Hall Y1) is a lateral Hall plate sensitive to the y-direction. Lateral Hall sensor element 34 (i.e., L-Hall Y2) is also a lateral Hall plate sensitive to the y-direction. Lateral Hall sensor elements 33 and 34 form a second differential sensor pair that are used by sensor circuitry to generate a second differential measurement signal for an y-magnetic field component (By) of the magnetic field (B-field).

Since the first and second differential measurement signals are shifted by 90° from each other, a first angle measurement can be derived therefrom.

Additionally, vertical Hall sensor element 35 (i.e., V-hall X) is a vertical Hall plate sensitive to the x-direction and vertical Hall sensor element 36 (i.e., V-hall Y) is a vertical Hall plate sensitive to the y-direction. Sensor signals generated by vertical Hall sensor elements 35 and 36 are shifted by 90° from each other. Thus, a second angle measurement can be derived therefrom that is separate and independent from the first angle measurement made using the lateral Hall sensor elements 31-34.

As will be described below, the first angle measurement and the second angle measurement should match or substantially match within an acceptable margin of tolerance (e.g., within 5% of each other). Otherwise, an error in one or both measurements may be present, which can be flagged and/or discriminated by the sensor circuit.

Furthermore, while the arrangement of the sensor elements shows that the vertical Hall sensor elements 35 and 36 are placed "inside" a perimeter of or "surrounded" by the lateral Hall sensor elements 31-34, the arrangement is not limited thereto. For example, the vertical Hall sensor elements 35 and 36 are placed "outside" a perimeter of the lateral Hall sensor elements 31-34. Instead, assuming the rotation axis 21 extends through the center of magnet 20, it is important that the vertical Hall sensor elements 35 and 36 are placed equidistant from an extension of the rotation axis 21. Similarly, lateral Hall sensor elements 31 and 32 should be placed equidistant from an extension of the rotation axis 21 with respect to each other, and lateral Hall sensor elements 33 and 34 should be placed equidistant from an extension of the rotation axis 21 with respect to each other.

Since the lateral Hall plates and the vertical Hall plates are constructed differently, the chip 30 provides redundancy of two different Hall-based measurement principles. Here, using both Hall-based measurement principles in a single chip makes it possible to diversify the magnetic angle measurement, which increases the functional safety. The following figures illustrate how the different Hall plates can be architecturally integrated into a chip design.

Figure 3A:
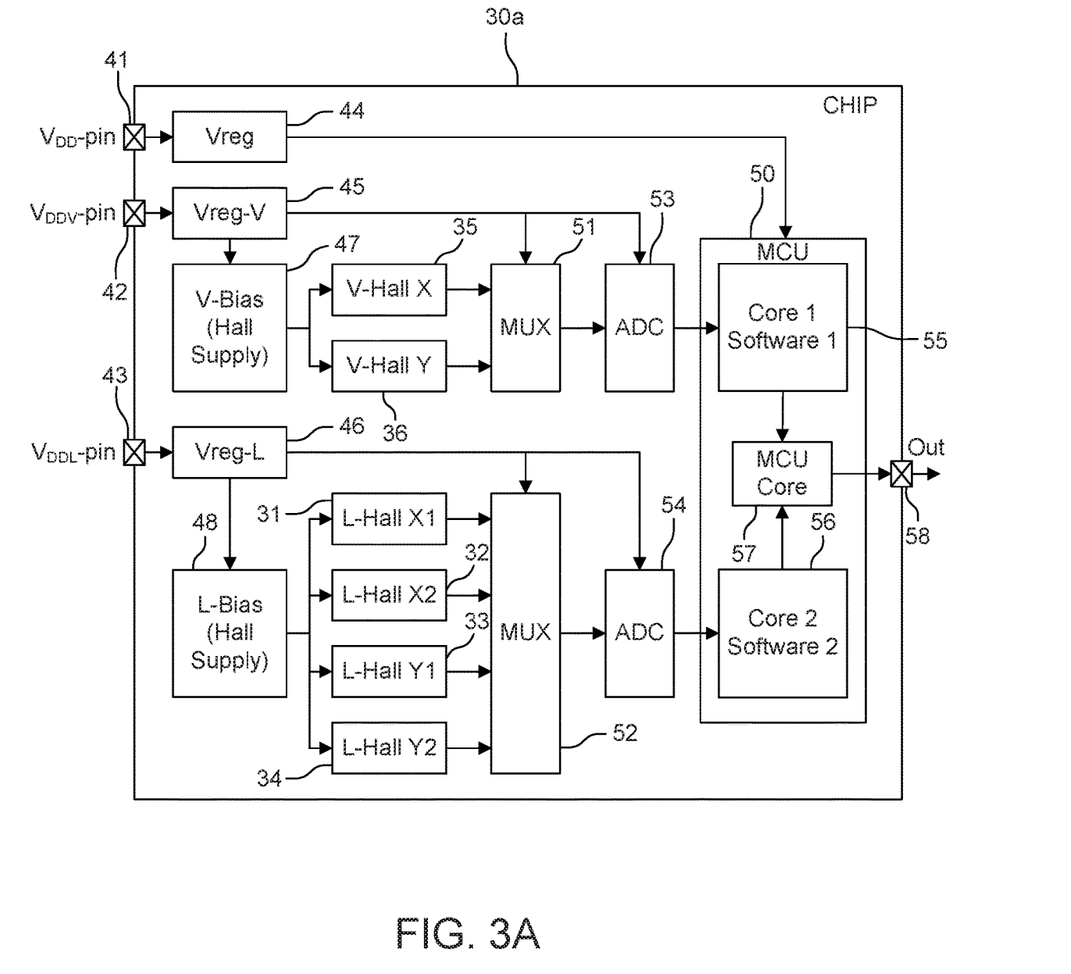
FIGS. 3A-3C are schematic diagrams illustrating sensor chips used in a magnetic angle sensor system according to one or more embodiments.
Figure 3B:
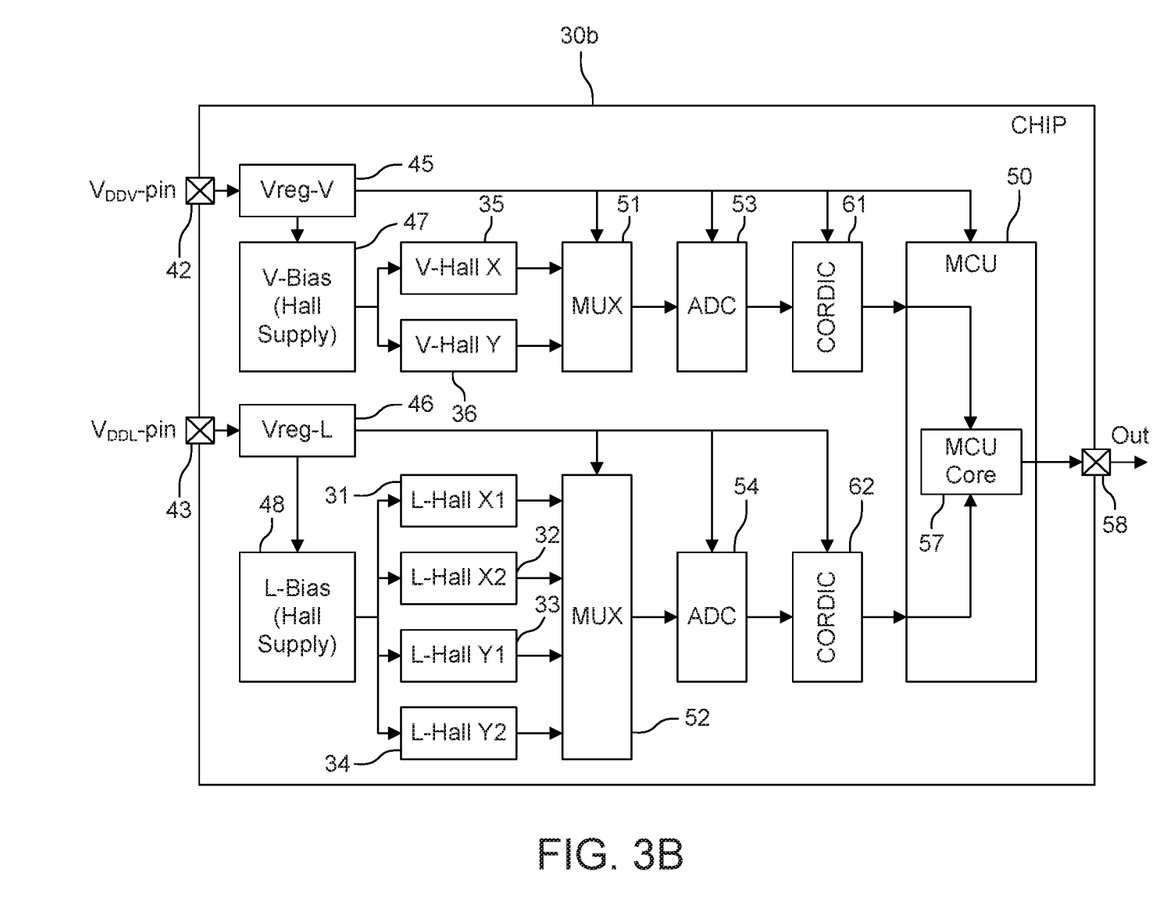
Figure 3C:
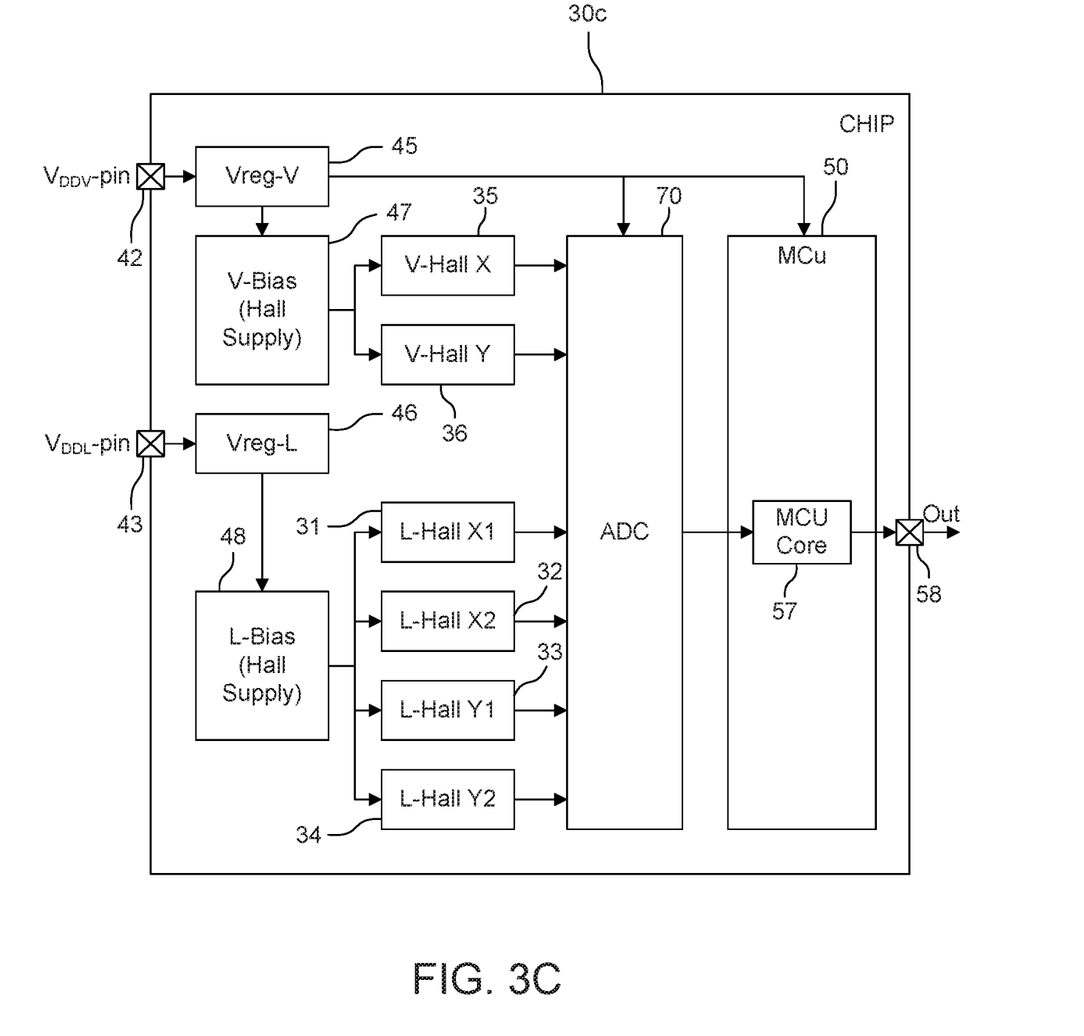

FIGS. 3A-3C are schematic diagrams illustrating sensor chips used in a magnetic angle sensor system according to one or more embodiments. In particular, the sensor chips shown in FIGS. 3A-3C are schematic variations of the sensor chip 30 shown in FIG. 2, while still using the specific placement constraints of the Hall plates 31-36 on the chip 30 as described in reference to FIG. 2. That is, FIG. 2 shows the arrangement on the chip 30, while FIGS. 3A-3C show different schematic arrangements.

FIG. 3A is schematic diagram of sensor chip 30a that includes Hall sensor elements 31-36 separated into two sets of Hall elements, where one set corresponds to the lateral Hall sensor elements 31-34 and the other set corresponds to the vertical Hall sensor elements 35 and 36.

The chip 30a includes three IC power supply pins 41-43 configured to be coupled to a voltage supply. Additionally, the chip 30a includes three voltage regulators 44-46 (i.e., Vreg, Vreg-V, and Vreg-L), each coupled to a respective IC power supply pin 41-43.

The chip 30a further includes a Hall voltage supply 47 and 48 for each set of Hall elements, a multiplexer (MUX) 51 and 52 for each set of Hall elements, an ADC 53 and 54 for each set of Hall elements, and a microcontroller (MCU) 50.

Each voltage regulator 44-46 is configured to receive a voltage from its IC power supply pin, and generate a regulated voltage to be supplied to further chip components. For example, voltage regulator 44 provides a regulated voltage to the MCU 50. Voltage regulator 45 provides a regulated voltage to the Hall voltage supply (i.e., V-Bias) 47, MUX 51, and ADC 53. Voltage regulator 46 provides a regulated voltage to the Hall voltage supply (i.e., L-Bias) 48, MUX 52, and ADC 54. Thus, three regulated voltages that are independent from each other, are supplied by the voltage regulators 44-46. Different voltage regulators are used for separating the Hall plate biasing of the different types of Hall plates. Thus, increasing the number of voltage regulators increases the level of functional safety of the chip 30a.

The Hall voltage supplies 47 and 48 are configured to provide a DC voltage to each of its respective Hall sensor elements. The supplied DC voltage generates a current that passes through each sensor element and ultimately results in a Hall voltage representative of a magnetic field strength of the magnetic field detected in the sensing direction. Thus, Hall voltage supply 47 provides a bias voltage V-Bias to vertical Hall sensor elements 35 and 36, whereas Hall voltage supply 48 provides a bias voltage L-Bias to lateral Hall sensor elements 31-34.

Multiplexer 51 is configured to receive the sensor signals from the vertical Hall sensor elements 35 and 36 and switchably output the sensor signals to the ADC 53, which in turn converts the sensor signals from analog to digital. The digital signals are then provided to the MCU 50. Alternatively, MUX 51 could be removed and two ADCs, each dedicated to one of the vertical Hall sensor elements 35 and 36, could be provided.

Multiplexer 52 is configured to receive the sensor signals from the lateral Hall sensor elements 31-34 and switchably output the sensor signals to the ADC 54, which in turn converts the sensor signals from analog to digital. The digital signals are then provided to the MCU 50. Alternatively, MUX 52 could be removed and four ADCs, each dedicated to one of the lateral Hall sensor elements 31-34, could be provided.

The MCU 50 includes a first angle measurement core 55, a second angle measurement core 56, and a main processing core 57. The first angle measurement core 55 is configured to receive digital sensor signals from ADC 53 derived from the vertical Hall sensor elements 35 and 36, and the second angle measurement core 56 is configured to receive digital sensor signals from ADC 54 derived from the lateral Hall sensor elements 31-34. Each angle measurement core 55 and 56 includes processing circuitry and software (e.g., software 1 or software 2) for performing the angle measurements to calculate angle values based on the received digital sensor signals. Specifically, each core 55 and 56 includes its own set of processing blocks 2-5 shown in FIG. 1. Thus, each core 55 and 56, using its respective blocks 2-5 and software performs temperature compensation (TC), self-calibration, filtering, and angle calculations, and outputs the angle values to the main processing core 57. In addition, core 56 performs differential calculus for deriving the differential measurement signals.

To add an additional layer of diversity, software 1 and software 2 may be diverse from each other. That is, the algorithms used in software 1 and software 2 for deriving the angle values may be different such that the two cores 55 and 56 are less likely to be susceptible to the same type of error.

The main processing core 57 is configured to receive the angle values from the first core 55 and the angle values from the second core 56, and compare the two sets of angle values to verify whether they are within an acceptable tolerance range of each other. For example, the main processing core 57 may determine whether a difference between a first angle value from the first core 55 and a second angle value from the second core 56 is less than a predetermined threshold value. If so, the main processing core 57 may determine that no error is present and no error indicator is generated. However, if the determined difference meets or exceeds the predetermined threshold value, the main processing core 57 may determine that an error is present and that a possible failure exists in one of the sets of Hall elements (i.e., in either the lateral Hall sets of the vertical Hall sets). In this case, the main processing core 57 generates an error indicator and outputs the error indicator via an output pin 58.

Additionally or alternatively, the main processing core 57 may diagnose the error. The main processing core 57 may determine which sensor path (i.e., the lateral Hall sensor path or the vertical Hall sensor path) is faulty and deactivate or ignore the faulty sensor path. The main processing core 57 may output information specifying the origin of the error via the output pin 58.

FIG. 3B is schematic diagram of sensor chip 30b that includes Hall sensor elements 31-36 separated into two sets of Hall elements, where one set corresponds to the lateral Hall sensor elements 31-34 and the other set corresponds to the vertical Hall sensor elements 35 and 36. Aspects of sensor chip 30b similar to sensor chip 30a will not be repeated for the sake of brevity.

Chip 30b includes two IC power supply pins 42 and 43 configured to be coupled to a voltage supply. Additionally, the chip 30b includes two voltage regulators 45 and 46 (i.e., Vreg-V, and Vreg-L), each coupled to a respective IC power supply pin 42 and 43. Thus, chip 30b is similar to chip 30a, except pin 41 and voltage regulator 44 have been removed. Instead, one voltage regulator supplies power to both one set of Hall elements and the MCU 50 and the other voltage regulator supplies power to the other set of Hall elements. While is it shown that the first voltage regulator 45 supplies to the vertical Hall set and the MCU 50, it could be that the second voltage regulator 46 supplies to the lateral Hall set and the MCU 50 instead. This would leave the first voltage regulator 45 supplying power only to the vertical Hall set and its respective components.

Additionally, the MCU 50 does not includes separate cores for performing the angle measurements. Instead, separate angle measurements may be performed external to the MCU 50 by a separate COordinate Rotation DIgital Computer (CORDIC) provided on each sensor path. In particular, a CORDIC 61 is coupled between the ADC 53 and the MCU 50 and receives digital sensor signals from the ADC 53, performs arctan calculations based on the received digital sensor signals, and outputs an angle value to the MCU 50. Similarly, a CORDIC 62 is coupled between the ADC 54 and the MCU 50 and receives digital sensor signals from the ADC 54, performs arctan calculations based on the received digital sensor signals, and outputs an angle value to the MCU 50.

In turn, the main processing core 57 is configured to receive the angle values from CORDIC 61 and CORDIC 62, compare the two sets of angle values to verify whether they are within an acceptable tolerance range of each other, and perform further action as described above.

The design provided by chip 30b is less diverse and thus provides less functional safety when compared to chip 30a. However, the design results in lower complexity and cost.

FIG. 3C is schematic diagram of sensor chip 30c that includes Hall sensor elements 31-36 separated into two sets of Hall elements, where one set corresponds to the lateral Hall sensor elements 31-34 and the other set corresponds to the vertical Hall sensor elements 35 and 36. Aspects of sensor chip 30c similar to sensor chips 30a and 30b will not be repeated for the sake of brevity.

Chip 30c includes two IC power supply pins 42 and 43 configured to be coupled to a voltage supply. Additionally, the chip 30c includes two voltage regulators 45 and 46 (i.e., Vreg-V, and Vreg-L), each coupled to a respective IC power supply pin 42 and 43. Thus, chip 30c is similar to chip 30b, except that the voltage regulator 46 is only responsible for suppling to power to one component (i.e., the Hall voltage supply 48).

Additionally, chip 30c does not include any multiplexers. Instead, an ADC block 70 including dedicated ADCs for each Hall sensor element 31-36 is provided. Thus, ADC block 70 includes six ADCs configured to convert the analog sensor signals into digital sensor signals and provide the digital sensor signals to the main processing core 57 of the MCU 50.

The MCU 50 does not includes separate cores for performing the angle measurements. Instead, the main processing core 57 performs the angle measurements for the vertical Hall set and for the lateral Hall set, compares the two sets of angle values to verify whether they are within an acceptable tolerance range of each other, and performs further action as described above.

The design provided by chip 30c is less diverse and thus provides less functional safety when compared to chips 30a and 30b. However, the design results in lower complexity and cost. Each chip 30a-30c provides redundancy of two different Hall-based measurement principles. Here, using both Hall-based measurement principles in a single chip makes it possible to diversify the magnetic angle measurement, which increases the functional safety. In addition, the chips 30a-30c use different voltage regulators for separating the Hall plate biasing of the different types of Hall plates. Thus, increasing the number of voltage regulators increases the level of functional safety of the chips. The level of functional safety may be further increased from chip 30c to chip 30b to chip 30a by adding additional layers of diversity and redundancy.

While the above embodiments are described in the context of detecting a shaft angle, the sensor may be used to detect the angle of any rotating member or object that creates sinusoidal variations in a magnetic field as it rotates and that may be sensed by a sensor.

Further, while various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. Such hardware, software, and firmware may be implemented within the same device or within separate devices to support the various techniques described in this disclosure.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A magnetic angle sensor, comprising:
a semiconductor chip;
a pair of vertical Hall sensor elements integrated with the semiconductor chip and each configured to generate vertical Hall sensor signals in response to a magnetic field impinging thereon;
a first pair of lateral Hall sensor elements integrated with the semiconductor chip and each configured to generate first lateral Hall sensor signals in response to the magnetic field impinging thereon;
a second pair of lateral Hall sensor elements integrated with the semiconductor chip and each configured to generate second lateral Hall sensor signals in response to the magnetic field impinging thereon; and
a sensor circuit integrated with the semiconductor chip, the sensor circuit configured to:
determine a first angle value corresponding to an orientation of the magnetic field based on the vertical Hall sensor signals,
determine a second angle value corresponding to the orientation of the magnetic field based on the first lateral Hall sensor signals and the second lateral Hall sensor signals,
determine whether the first angle value and the second angle value are within an acceptable tolerance range of each other, and
generate an error indication on a condition that the first angle value and the second angle value are not within the acceptable tolerance range of each other.

2. The magnetic angle sensor of claim 1, wherein the sensor circuit is configured to determine a difference between the first angle value and the second angle value, compare the difference to a predetermined threshold value, and determine that the first angle value and the second angle value are not within the acceptable tolerance range of each other on a condition that the difference exceeds the predetermined threshold value.

3. The magnetic angle sensor of claim 1, wherein the sensor circuit is configured to generate a first differential measurement signal based on the first lateral Hall sensor signals, generate a second differential measurement signal based on the second lateral Hall sensor signals, and determine the second angle value based on the first differential measurement signal and the second differential measurement signal.

4. The magnetic angle sensor of claim 1, wherein the sensor circuit comprises a microcontroller configured to determine whether the first angle value and the second angle value are within the acceptable tolerance range of each other and generate the error indication on the condition that the first angle value and the second angle value are not within the acceptable tolerance range of each other.

5. The magnetic angle sensor of claim 4, wherein the microcontroller is configured to determine the first angle value and the second angle value.

6. The magnetic angle sensor of claim 4, wherein the microcontroller includes a first processing core configured to determine the first angle value, a second processing core configured to determine the second angle value, and a third processing core configured to determine whether the first angle value and the second angle value are within the acceptable tolerance range of each other and generate the error indication on the condition that the first angle value and the second angle value are not within the acceptable tolerance range of each other.

7. The magnetic angle sensor of claim 6, wherein the first processing core is configured to implement a first software to determine the first angle value and the second processing core is configured to implement a second software to determine the second angle value, wherein the first software and the second software are diverse with respect to each other.

8. The magnetic angle sensor of claim 1, further comprising:
a first voltage regulator integrated with the semiconductor chip and coupled to a first integrated circuit (IC) power supply pin of the semiconductor chip, the first voltage regulator configured to generate a first regulated voltage;
a second voltage regulator integrated with the semiconductor chip and coupled to a second IC power supply pin of the semiconductor chip, the second voltage regulator configured to generate a second regulated voltage;
a first Hall voltage supply configured to receive the first regulated voltage from the first voltage regulator and provide a first bias voltage to the pair of vertical Hall sensor elements; and
a second Hall voltage supply configured to receive the second regulated voltage from the second voltage regulator and provide a second bias voltage to the first pair of lateral Hall sensor elements and to the second pair of lateral Hall sensor elements.

9. The magnetic angle sensor of claim 8, wherein:
the sensor circuit comprises a microcontroller configured to determine whether the first angle value and the second angle value are within the acceptable tolerance range of each other and generate the error indication on the condition that the first angle value and the second angle value are not within the acceptable tolerance range of each other, and
one of the first voltage regulator or the second voltage regulator is coupled to the microcontroller and is configured to provide the first regulated voltage or the second regulated voltage to the microcontroller, respectively.

10. The magnetic angle sensor of claim 9, wherein the sensor circuit further comprises:
a first COordinate Rotation DIgital Computer (CORDIC) configured to generate the first angle value based on the vertical Hall sensor signals, and provide the first angle value to the microcontroller; and
a second CORDIC configured to generate the second angle value based on the first lateral Hall sensor signals and the second lateral Hall sensor signals, and provide the second angle value to the microcontroller,
wherein the first voltage regulator is coupled to the first CORDIC and is configured to provide the first regulated voltage to the first CORDIC, and
wherein the second voltage regulator is coupled to the second CORDIC and is configured to provide the second regulated voltage to the second CORDIC.

11. The magnetic angle sensor of claim 9, wherein the microcontroller includes a first processing core configured to determine the first angle value, a second processing core configured to determine the second angle value, and a third processing core configured to determine whether the first angle value and the second angle value are within the acceptable tolerance range of each other and generate the error indication on the condition that the first angle value and the second angle value are not within the acceptable tolerance range of each other.

12. The magnetic angle sensor of claim 8, further comprising:
a third voltage regulator integrated with the semiconductor chip and coupled to a third IC power supply pin of the semiconductor chip, the third voltage regulator configured to generate a third regulated voltage,
wherein the sensor circuit comprises a microcontroller configured to determine whether the first angle value and the second angle value are within the acceptable tolerance range of each other and generate the error indication on the condition that the first angle value and the second angle value are not within the acceptable tolerance range of each other, and
wherein the third voltage regulator is coupled to the microcontroller and configured to provide the third regulated voltage to the microcontroller.

13. The magnetic angle sensor of claim 12, wherein the microcontroller includes a first processing core configured to determine the first angle value, a second processing core configured to determine the second angle value, and a third processing core configured to determine whether the first angle value and the second angle value are within the acceptable tolerance range of each other and generate the error indication on the condition that the first angle value and the second angle value are not within the acceptable tolerance range of each other.

14. The magnetic angle sensor of claim 1, wherein:
the pair of vertical Hall sensor elements include a first vertical Hall sensor element sensitive to a first magnetic field component of the magnetic field aligned in a first direction and a second vertical Hall sensor element sensitive to a second magnetic field component of the magnetic field aligned in a second direction orthogonal to the first direction,
the first pair of lateral Hall sensor elements include a first lateral Hall sensor element and a second lateral Hall sensor element both sensitive to the first magnetic field component, and
the second pair of lateral Hall sensor elements include a third lateral Hall sensor element and a fourth lateral Hall sensor element both sensitive to the second magnetic field component.

15. A magnetic angle sensor system, comprising:
a magnet configured to rotate about a rotation axis and configured to produce a magnetic field;
a semiconductor chip;
a pair of vertical Hall sensor elements integrated with the semiconductor chip and each configured to generate vertical Hall sensor signals in response to the magnetic field impinging thereon;
a first pair of lateral Hall sensor elements integrated with the semiconductor chip and each configured to generate first lateral Hall sensor signals in response to the magnetic field impinging thereon;
a second pair of lateral Hall sensor elements integrated with the semiconductor chip and each configured to generate second lateral Hall sensor signals in response to the magnetic field impinging thereon; and
a sensor circuit integrated with the semiconductor chip, the sensor circuit configured to:
determine a first angle value corresponding to an orientation of the magnetic field based on the vertical Hall sensor signals,
determine a second angle value corresponding to the orientation of the magnetic field based on the first lateral Hall sensor signals and the second lateral Hall sensor signals, determine whether the first angle value and the second angle value are within an acceptable tolerance range of each other, and generate an error indication on a condition that the first angle value and the second angle value are not within the acceptable tolerance range of each other.

16. The magnetic angle sensor system of claim 15, wherein:

the pair of vertical Hall sensor elements include a first vertical Hall sensor element sensitive to a first magnetic field component of the magnetic field aligned in a first direction and a second vertical Hall sensor element sensitive to a second magnetic field component of the magnetic field aligned in a second direction orthogonal to the first direction, the first pair of lateral Hall sensor elements include a first lateral Hall sensor element and a second lateral Hall sensor element both sensitive to the first magnetic field component, and the second pair of lateral Hall sensor elements include a third lateral Hall sensor element and a fourth lateral Hall sensor element both sensitive to the second magnetic field component.

17. The magnetic angle sensor system of claim 16, wherein:

the first lateral Hall sensor element and the second lateral Hall sensor element are equidistant from an extension of the rotation axis, the first lateral Hall sensor element and the second lateral Hall sensor element are equidistant from the extension of the rotation axis, and the third lateral Hall sensor element and the fourth lateral Hall sensor element are equidistant from the extension of the rotation axis.

18. A method for determining an orientation angle of a magnetic field, the method comprising:

generating, by a pair of vertical Hall sensor elements integrated with the semiconductor chip, vertical Hall sensor signals in response to the magnetic field impinging thereon;

generating, by a first pair of lateral Hall sensor elements integrated with the semiconductor chip, first lateral Hall sensor signals in response to the magnetic field impinging thereon;

generating, by a second pair of lateral Hall sensor elements integrated with the semiconductor chip, second lateral Hall sensor signals in response to the magnetic field impinging thereon;

determining, by a sensor circuit integrated with the semiconductor chip, a first angle value corresponding to an orientation of the magnetic field based on the vertical Hall sensor signals;

determining, by the sensor circuit, a second angle value corresponding to the orientation of the magnetic field based on the first lateral Hall sensor signals and the second lateral Hall sensor signals;

determining, by the sensor circuit, whether the first angle value and the second angle value are within an acceptable tolerance range of each other; and generating, by the sensor circuit, an error indication on a condition that the first angle value and the second angle value are not within the acceptable tolerance range of each other.

19. The method of claim 18, wherein:

the pair of vertical Hall sensor elements include a first vertical Hall sensor element sensitive to a first magnetic field component of the magnetic field aligned in a first direction and a second vertical Hall sensor element sensitive to a second magnetic field component of the magnetic field aligned in a second direction orthogonal to the first direction, the first pair of lateral Hall sensor elements include a first lateral Hall sensor element and a second lateral Hall sensor element both sensitive to the first magnetic field component, and the second pair of lateral Hall sensor elements include a third lateral Hall sensor element and a fourth lateral Hall sensor element both sensitive to the second magnetic field component.

20. The method of claim 18, further comprising:

providing, by a first voltage regulator integrated with the semiconductor chip, a first regulated voltage to a first Hall voltage supply configured;

providing, by the first Hall voltage supply integrated with the semiconductor chip, a first bias voltage to the pair of vertical Hall sensor elements by using the first regulated voltage;

providing, by a second voltage regulator integrated with the semiconductor chip, a second regulated voltage to a second Hall voltage supply; and providing, by the second Hall voltage supply integrated with the semiconductor chip, a second bias voltage to the first pair of lateral Hall sensor elements and to the second pair of lateral Hall sensor elements by using the second regulated voltage.

* * * * *